United States Patent
Marinet et al.

(10) Patent No.: US 9,082,609 B2
(45) Date of Patent: Jul. 14, 2015

(54) ELECTRIC CHARGE FLOW ELEMENT

(71) Applicant: STMicroelectronics (Rousset) SAS, Rousset (FR)

(72) Inventors: Fabrice Marinet, Chateauneuf le Rouge (FR); Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 100 days.

(21) Appl. No.: 13/953,003

(22) Filed: Jul. 29, 2013

(65) Prior Publication Data

US 2014/0027881 A1    Jan. 30, 2014

(30) Foreign Application Priority Data

Jul. 30, 2012 (FR) .................. 12 57354

(51) Int. Cl.
- H01L 29/94 (2006.01)
- H01L 27/00 (2006.01)
- G11C 27/02 (2006.01)
- H01L 49/02 (2006.01)
- G04F 10/10 (2006.01)

(52) U.S. Cl.
CPC .............. *H01L 27/00* (2013.01); *G11C 27/024* (2013.01); *H01L 28/40* (2013.01); *H01L 28/60* (2013.01); *G04F 10/10* (2013.01)

(58) Field of Classification Search
CPC ........................................ H01L 29/94
USPC ........................................ 257/532
See application file for complete search history.

(56) References Cited

U.S. PATENT DOCUMENTS

| | | | |
|---|---|---|---|
| 8,331,203 B2 | 12/2012 | La Rosa | |
| 2002/0084479 A1 | 7/2002 | Pan et al. | |
| 2005/0135411 A1 | 6/2005 | Sureaud | |
| 2006/0003522 A1 | 1/2006 | Lin et al. | |
| 2010/0027334 A1 | 2/2010 | La Rosa et al. | |
| 2013/0088263 A1* | 4/2013 | La Rosa et al. | 327/80 |

OTHER PUBLICATIONS

French Search Report and Written Opinion dated Apr. 10, 2013 from corresponding French Application No. 12/57354.

* cited by examiner

*Primary Examiner* — Lex Malsawma
(74) *Attorney, Agent, or Firm* — Seed IP Law Group PLLC

(57) ABSTRACT

An electric charge flow element including, on an insulating support, a stack of a first electrode, of a dielectric layer having at least one portion capable of letting charges flow by tunnel effect, and of a second electrode, wherein at least one of the electrodes is made of undoped polysilicon.

15 Claims, 3 Drawing Sheets

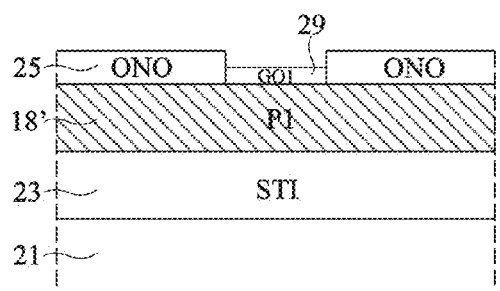
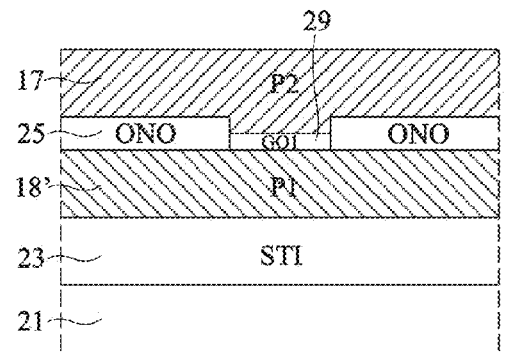
Fig 3E  Fig 3F
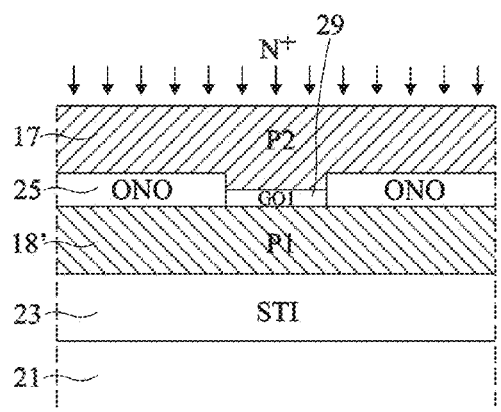
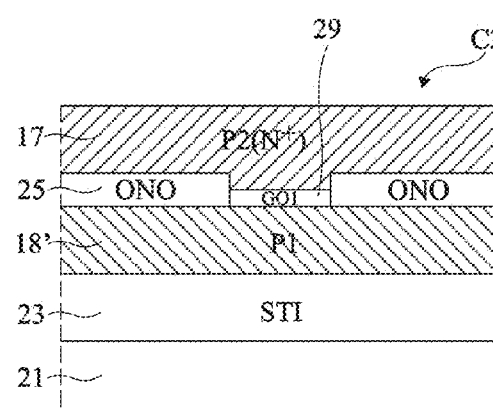
Fig 3G  Fig 3H
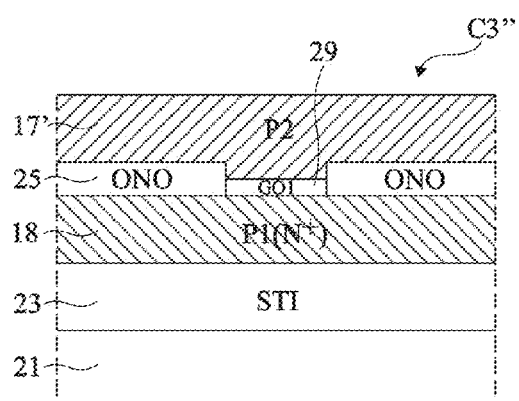
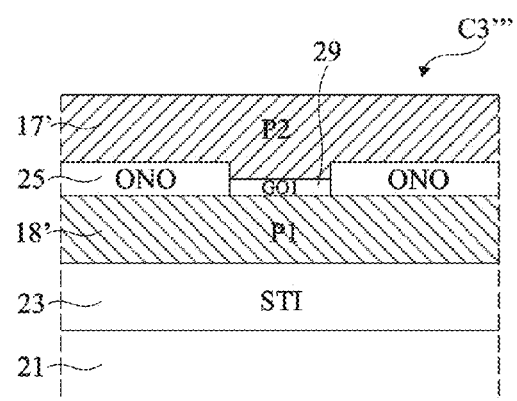
Fig 4  Fig 5

ELECTRIC CHARGE FLOW ELEMENT

CROSS REFERENCE TO RELATED APPLICATIONS

This application claims the priority benefit of French patent application serial number 12/57354, filed on Jul. 30, 2012, which is hereby incorporated by reference to the maximum extent allowable by law.

BACKGROUND

1. Technical Field

The present disclosure generally relates to electronic circuits, and in particular to the forming of a circuit enabling to controllably retain electric charges for a time measurement. It more specifically relates to the forming of an electric charge flow element.

2. Discussion of the Related Art

In many applications, it is desired to have information representative of a time elapsed between two events, be it an accurate or approximate measurement. An example of application relates to the time management of rights of access, especially to media.

The obtaining of such information representative of the elapsed time conventionally requires a time measurement by an electronic circuit powered, for example, by means of a battery, to avoid losing the information variation when the circuit is not being used.

It would be desirable to have a time measurement which works even when the electronic measurement circuit is not being powered.

An electronic device where the time elapsed between two events is determined by measuring the charge of a capacitive storage element having an electrode connected to an electrode of a capacitive charge flow element having a leakage in its dielectric space has already been provided, for example, in U.S. Pat. No. 8,331,203. The storage element is charged when the device is powered, and its residual charge, after interruption of the power supply, is measured when the device is powered again. This residual charge is considered as representative of the time period elapsed between the two times of power supply of the device.

The charge flow element comprises a region of smaller thickness in its dielectric space, capable of letting charges leak by tunnel effect. The storage element discharge speed depends on the dimensions of the leakage region of the flow element. In particular, the storage element discharge speed increases when the thickness of the leakage element decreases and/or when the surface (in top view) of the leakage region increases.

A disadvantage is that, in practice, the sizing of the leakage region is strongly dependent on the considered technological manufacturing process. Indeed, the charge retention circuit is generally integrated to a chip comprising other components, for example, memories, logic blocks, etc. To avoid increasing the chip manufacturing cost, it is desired to form the charge retention circuit with no additional manufacturing step with respect to the steps of manufacturing of the other components. In certain recent technological processes, the dielectric layers available to form the leakage region of the flow element are too thin to enable a slow discharge of the storage element, even when the surface area of the leakage region is decreased to a minimum. As a result, the time measurement may only work, in the absence of power supply, during a very short time, poorly adapted to most applications.

SUMMARY

Thus, an embodiment provides an electric charge flow element at least partly overcoming some of the disadvantages of known charge flow elements.

Another embodiment provides an electric charge retention circuit controllable for a time measurement.

Thus, an embodiment provides an electric charge flow element comprising, on an insulating support, a stack of a first electrode, of a dielectric layer having at least one portion capable of letting charges flow by tunnel effect, and of a second electrode, wherein at least one of the electrodes is made of undoped polysilicon.

According to an embodiment, one of the electrodes is made of heavily-doped polysilicon.

According to an embodiment, both electrodes are made of undoped polysilicon.

According to an embodiment, the dielectric layer comprises an oxide-nitride-oxide stack, the above-mentioned portion being made of silicon oxide.

According to an embodiment, the charge flow element has a capacitance between the two electrodes ranging between $1*10^{-15}$ and $10*10^{-15}$ farads.

Another embodiment provides a use of an electric charge flow element of the above-mentioned type, for a time measurement.

Another embodiment provides an electric charge retention circuit for a time measurement, comprising a capacitive charge storage element connected to a charge flow element of the above-mentioned type.

According to an embodiment, the capacitive storage element has a capacitance ranging between $10^{-12}$ and $100*10^{-12}$ farads.

According to an embodiment, the charge retention circuit further comprises a capacitive initialization element connected to a floating node common to the storage element and to the flow element.

According to an embodiment, the capacitive initialization element has a capacitance ranging between $10*10^{-15}$ and $100*10^{-15}$ farads.

Another embodiment provides an integrated circuit chip formed inside and on top of a semiconductor substrate, comprising non-volatile memory cells, logic blocks comprising MOS transistors, and an electric charge retention circuit of the above-mentioned type.

BRIEF DESCRIPTION OF THE DRAWINGS

The foregoing and other features and advantages will be discussed in detail in the following non-limiting description of specific embodiments in connection with the accompanying drawings.

FIGS. 3A to 3H are cross-section views showing steps of a method for manufacturing an embodiment of an electric charge flow element;

FIG. 4 is a cross-section view showing an alternative embodiment of the electric charge flow element of FIG. 3H; and FIG. 5 is a cross-section view showing another alternative embodiment of the electric charge flow element of FIG. 3H.

DETAILED DESCRIPTION

Figure 1:
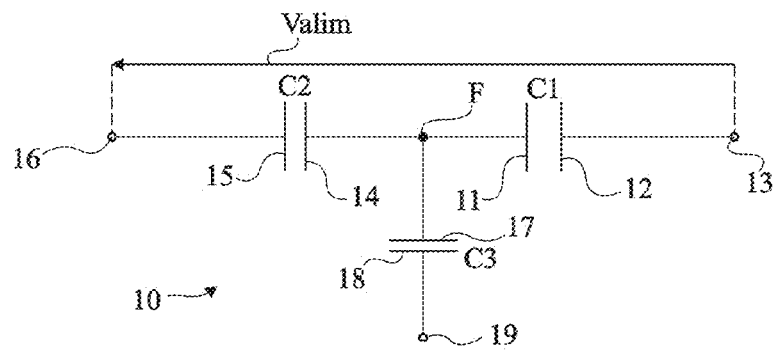
FIG. 1 is an electric diagram of an example of a circuit capable of controllably retaining electric charges for a time measurement.

For clarity, the same elements have been designated with the same reference numerals in the different drawings and, further, as usual in the representation of integrated circuits, the various drawings are not to scale. Further, only those elements which are useful to the understanding of the embodiments have been shown and will be described. In particular, the destination of the time measurements generated by the described circuits has not been detailed, the described embodiments being compatible with usual applications of such time measurements.

FIG. 1 is an electric diagram of an example of a circuit 10 capable of controllably retaining electric charges for a time measurement. Circuit 10 comprises a first capacitive element C1 having a first electrode 11 connected to a floating node F and having a second electrode 12 connected to a terminal 13 of application of a voltage, and a second capacitive element C2 having a first electrode 14 connected to a node F and having a second electrode 15 connected to a terminal 16 of application of a voltage. Circuit 10 further comprises a third capacitive element C3 having a first electrode 17 connected to node F and having a second electrode 18 connected to a terminal 19 of application of a voltage, and having its dielectric space designed, due to its permittivity and/or to its thickness, to have a non negligible leakage along time. Capacitive element C1 has a charge retention capacity greater than that of element C3, and capacitive element C2 has a charge retention capacity greater than that of element C3, but smaller than that of element C1.

A function of capacitive element C1 (storage element) is to store electric charges. A function of capacitive element C3 (flow element) is to discharge storage element C1 relatively slowly with respect to a direct ground connection of its electrode 11. A function of capacitive element C2 is to allow a fast injection (or removal) (for example, at least one hundred times faster than through capacitive element C3) of charges in capacitive element C1.

In a charge retention phase initialization step, terminals 13 and 19 are at a reference voltage, for example, the ground, and a high power supply voltage (positive with respect to ground) Valim is applied to terminal 16, which causes the charge of capacitive element C1. As a variation, to charge element C1, terminal 19 may be grounded, and terminals 16 and 13 may be set to voltages respectively positive and negative with respect to ground.

When the power supply voltage is no longer applied between terminals 16 and 13, for example, when the circuit is no longer powered, storage element C1 discharges in a controlled fashion (relatively slowly) through flow element C3. It should be noted that a controlled discharge phase may also be provided when the circuit is still being powered. During the discharge phase, terminals 13, 16, and 19 may be left floating, or even set to a same reference voltage, for example, the ground.

In a read phase, after a discharge phase, the residual charge of storage element C1 is measured (the measurement requires for the device to be powered). The residual charge of element C1 is considered as representative of the time elapsed between the end of the initialization step and the read step.

A reset step may possibly be provided to fully discharge storage element C1 through capacitive element C2. For this purpose, terminals 19 and 16 may be grounded, and terminal 13 may be set to a high power supply voltage (for example, Valim). As a variation, terminal 19 may be grounded, and terminals 13 and 16 may be set to voltages respectively positive and negative with respect to ground.

A phase of accelerated controlled discharge of storage element C1 (trough flow element C3) may also be provided, for example, for purposes of testing of the time measurement circuit. To achieve this, terminal 19 may be grounded or set to a negative voltage with respect to ground, and terminals 13 and 16 may be biased to a same positive voltage with respect to ground, for example, a voltage ranging between the ground voltage and voltage Valim.

It should be noted that an embodiment which does not comprise capacitive element C2 may also be provided, in which floating node F is charged and discharged via capacitive element C3. In this case, the charge and discharge times are symmetrical.

Examples of embodiment and of operation of an electric charge retention circuit for a time measurement, of the type described in relation with FIG. 1, are described in further detail in above-mentioned U.S. Pat. No. 8,331,203. This document especially describes an example of a circuit capable of measuring the residual charge of storage element C1 and of deducing therefrom information relative to the time elapsed between the end of the step of initialization of a charge retention phase, and the read step.

The forming of controlled electric charge flow capacitive element C3 is more specifically considered herein.

Figure 2:
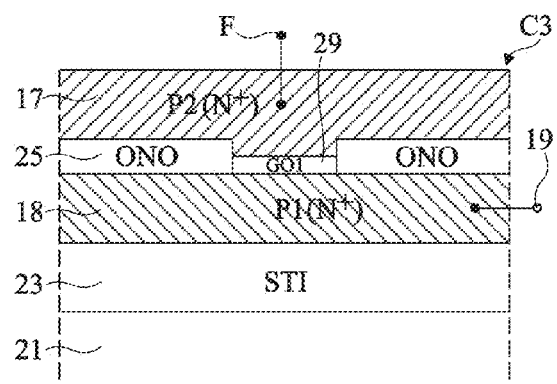
FIG. 2 is a cross-section view showing an example of an electric charge flow element.

FIG. 2 is a cross-section view showing an example of a capacitive electric charge flow element C3 for a time measurement. In this example, element C3 is formed in a technological semiconductor chip manufacturing process comprising both non-volatile memories and logic blocks based on MOS transistors (not shown in the drawing). The chips are formed from a semiconductor substrate 21, for example, made of silicon. The non-volatile memories are at least partly formed on an insulating layer 23, for example, made of silicon oxide. Layer 23 for example comprises insulating wells formed in the upper portion of the substrate according to an insulating region forming technique currently called STI, for Shallow Trench Insulation. Any other embodiment of an insulating layer 23 of adapted thickness may however be used. Each memory cell comprises, stacked in the following order from the upper surface of layer 23, a lower electrode formed in a first doped polysilicon level P1, an oxide-nitride-oxide dielectric stack (for example, silicon oxide-silicon nitride-silicon oxide) corresponding to a first ONO dielectric level, and an upper electrode formed in a second doped polysilicon level P2. The MOS transistors comprise, stacked in the following order above a properly-doped substrate region, a silicon oxide layer (gate insulator) formed in a second dielectric level GO1 having a smaller thickness than the ONO level, and a doped polysilicon gate formed in level P2. The doping of levels P1 and P2 results in increasing the electric conductivity of polysilicon to make it compatible with an electrode or gate use in non-volatile memories and MOS transistors. As an example, the polysilicon of levels P1 and P2 is first deposited in undoped form, after which a step of implantation of dopant elements, for example, of type N ($N^+$) is provided immediately after the deposition. The dopant element concentration of levels P1 and P2 after implantation for example ranges between $5 \times 10^{18}$ and $5 \times 10^{20}$ atoms/cm$^3$.

It is desired to form charge flow element C3 with no additional steps with respect to the memory cell and MOS transistor manufacturing steps, that is, by only using the above-mentioned levels.

For this purpose, charge flow element C3 comprises an insulating well 23 made of silicon oxide (STI), formed in the upper portion of substrate 21, and a lower doped polysilicon electrode 18 (N$^+$), formed at the surface of well 23 in level P1. Electrode 18 is coated with a dielectric layer 25, formed in the ONO level. A portion of layer 25, defining the leakage region of flow element C3, is removed by etching, the etching stopping on polysilicon P1 of electrode 18, and a dielectric layer 29, formed in level GO1, is formed on electrode 18 where the removed portion of layer 25 used to be. Charge flow element C3 further comprises a doped upper polysilicon electrode 17 (N$^+$), formed in level P2, coating dielectric layers 25 and 29.

Layer 29, defining the leakage region of element C3, should be capable, by its thickness and/or its dielectric permittivity, of letting electric charges flow between electrodes 17 and 18 by tunnel effect. The charge flow speed must be non-negligible, but sufficiently slow to allow a slow discharge of storage element C1 (FIG. 1), and thus a time measurement, in the absence of any power supply, for a significant time, for example of several hours or days.

In certain recent technological processes, the thickness of oxide GO1 is on the order of 2 nm, which is not sufficient to allow a slow discharge of storage element C1, even by decreasing the surface area (in top view) of leakage region 29 to a minimum. As an example, for a 2-nm thickness of oxide GO1, the discharge time of storage element C1 is on the order of one second, while it is of several hours for a 3-nm thickness of oxide GO1.

To overcome this disadvantage, it is provided to form an electric charge flow element where at least one of the two electrodes is made of undoped polysilicon. The absence of doping results in making the polysilicon more resistive and in modifying the space charge area, and accordingly in decreasing the charge flow speed between the two electrodes.

FIGS. 3A to 3H are cross-section views showing steps of a method for manufacturing an embodiment of an electric charge flow element comprising an undoped polysilicon electrode.

Figure 3A:
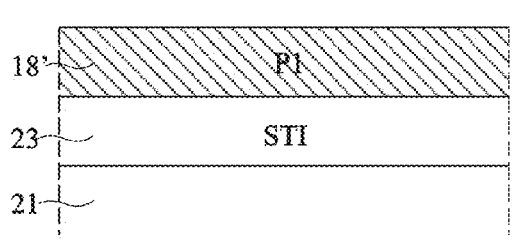

FIG. 3A illustrates the forming of a well 23 made of silicon oxide (STI), formed in the upper portion of substrate 21, and of a lower electrode 18' formed in polysilicon level P1 and coating well 23. It should be noted that layer 23 is not necessarily an STI-type well, but may be formed by any other adapted insulating layer forming method. In the case where the charge flow element is used in a time measurement circuit of the type described in relation with FIG. 1, the dielectric thickness (or equivalent thickness) between the substrate and electrode 18' is preferably at least equal to the dielectric thickness of capacitive element C2.

Figure 3B:
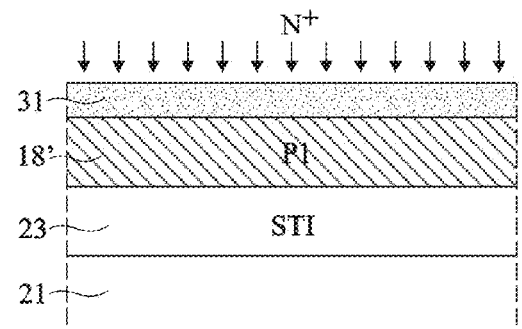

FIG. 3B illustrates a step of implantation of dopant elements into polysilicon level P1, aiming at increasing the conductivity of level P1 in regions of the chip for which this level is used to form electrodes or gates of non-volatile memories or of transistors. According to an aspect, it is provided, during this step, to mask lower electrode 18' of the charge flow element, for example, by means of a resin mask 31, to avoid doping electrode 18'. Mask 31 is a mask already provided in existing methods to protect certain regions of the chip during the implantation of polysilicon level P1. It is thus not necessary to provide a mask dedicated to the masking of electrode 18'. It is simply provided not to open the existing mask in front of electrode 18' during the step of implantation of level P1.

Figure 3C:
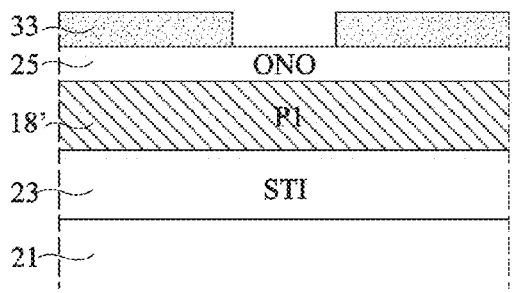

FIG. 3C illustrates a step of deposition of a dielectric layer 25, formed in the ONO level, at the surface of electrode 18' after removal of mask 31. A resin mask 33 is formed at the surface of dielectric layer 25, delimiting a window coinciding with the leakage region of the flow element.

Figure 3D:
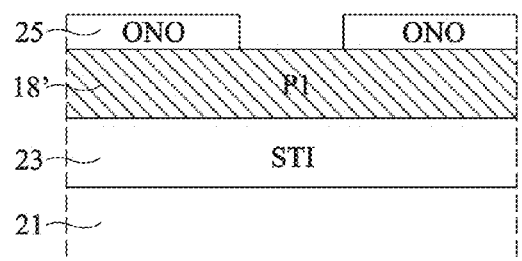

FIG. 3D illustrates a step during which the unmasked region of dielectric layer 25 is removed by etching, the etching stopping on polysilicon P1 of electrode 18'. Resin mask 33 is then removed.

FIG. 3E illustrates a step of forming of a dielectric layer 29, formed in level GO1, where layer 25 removed at the previous step used to be. As an example, level GO1 may be formed by oxide growth, for example, according to a rapid thermal processing, currently called RTP.

FIG. 3F illustrates the forming of an upper electrode 17 of the charge flow element, in polysilicon level P2.

FIG. 3G illustrates a step of doping of upper electrode 17 by implantation of dopant elements, for example, of type N (N$^+$).

FIG. 3H is a cross-section view of charge flow element C3' obtained at the end of the method described in relation with FIGS. 3A to 3G, that is, a charge flow element comprising, on an insulating support 23, a stack of a lower undoped polysilicon electrode 18', of a dielectric layer 25, 29 comprising a portion 29 capable of letting charges flow by tunnel effect, and of an upper doped polysilicon electrode 17 (N$^+$).

As an example, trials made by the present inventors have shown that by using a thin oxide GO1 having a thickness on the order of 2 nm, the resistivity of charge flow element C3' of FIG. 3H is on the order of $5 \times 10^{14}$ ohms per square, to be compared with $10^{12}$ ohms per square for flow element C3 of FIG. 2.

When charge flow element C3' is used in a time measurement circuit of the type described in relation with FIG. 1, this results in allowing a slow discharge of storage element C1, without modifying the thickness of leakage region 29. As an example, for an oxide thickness GO1 of 2 nm, the discharge time of storage element C1 is on the order of one second with element C3 of FIG. 2, while it is of several days with element C3' of FIG. 3H (for identical leakage region surface areas).

FIG. 4 is a cross-section view showing another alternative embodiment of electric charge flow element C3' of FIG. 3H. In charge flow element C3" of FIG. 4, lower electrode 18 is made of doped polysilicon (N$^+$) and upper electrode 17' is made of undoped polysilicon. The mask (not shown) used to mask electrode 17' during the implantation of level P2 is a mask already provided in existing methods to protect certain regions of the chip during the implantation of polysilicon level P2, or during the doping of the MOS transistor source-drain regions. It is thus not necessary to provide a mask dedicated to the masking of electrode 17'. It is simply provided not to open the existing mask in front of electrode 17' during the step of implantation of level P2.

FIG. 5 is a cross-section view showing another alternative embodiment of electric charge flow element C3' of FIG. 3H. In charge flow element C3''' of FIG. 5, lower electrode 18' and upper electrode 17' are both made of undoped polysilicon.

An advantage of the embodiments described in relation with FIGS. 3A to 3H, 4, and 5 is that they require no additional step with respect to the steps of manufacturing of an integrated circuit chip comprising both non-volatile memories and logic blocks based on MOS transistors. In an embodiment of a time measurement circuit of the type described in relation with FIG. 1, the thickness of the dielectric of storage element C1 ranges between 15 and 20 nm, the thickness of the dielectric of capacitive initialization element C2 ranges between 7 and 10 nm, the thickness of dielectric level GO1 is on the order of 2 nm, and the surface, in top view, of leakage regions 29, is a square or rectangular surface of from 0.3 to 0.4 μm by from 0.4 to 0.5 μm, for example 0.38 μm by 0.46 μm.

For the proper operation of the circuit, node F is preferably floating, that is, separated by a dielectric space, from any voltage application terminal, and not directly connected to a non-insulated region of the chip semiconductor substrate (in which case leakages in the substrate might be preponderating over leakages through the flow element).

As an example of embodiment, the capacitance of storage element C1 ranges between $10^{-12}$ and $100*10^{-12}$ farads (from 1 to 100 picofarads), for example being on the order of $20*10^{-12}$ farads, the capacitance of initialization element C2 ranges between $100*10^{-15}$ and $10^{-12}$ farads (from 100 to 1,000 femtofarads), for example, being on the order of $500*10^{-15}$ farads, and the capacitance of each charge flow element C3', C3'', or C3''' is negligible with respect to capacitances C1 and C2, for example ranging between $1*10^{-15}$ and $10*10^{-15}$ farads (from 1 to 10 femtofarads), for example, being on the order of $2*10^{-15}$ farads.

In any case, due to the used dielectric thicknesses, capacitive elements C1 and C2 have negligible parasitic leakages (through their dielectric spaces) with respect to flow element C3'. As an example, the capacitance of element C2 is formed by using as a dielectric an oxide usually used to form a non-volatile memory point capable of retaining information for at least 20 years while the charge flow time through element C3' may be on the order of a few days. With all the more reason, since the thickness of the dielectric of element C1 is greater than the dielectric thickness of element C2, parasitic leakages through element C1 are quite negligible with respect to leakages through the flow element.

Specific embodiments of the present invention have been described. Various alterations, modifications, and improvements will occur to those skilled in the art. In particular, it will be within the abilities of those skilled in the art to use a charge flow element of the provided type in any circuit capable of retaining electric charges for a time measurement, other than that described in relation with FIG. 1.

Besides, to further decrease the electric charge flow speed, it will be within the abilities of those skilled in the art to form a charge flow element comprising a plurality of charge flow elements of the type described in relation with FIGS. 3 to 5, series-connected.

Further, the present invention is not limited to the use of a charge flow element of the type described in relation with FIGS. 3 to 5 for a time measurement. It will be within the abilities of those skilled in the art to use a charge flow element of the above-described type in any other application requiring a resistance of strong value taking up a small surface area.

Figure 6:
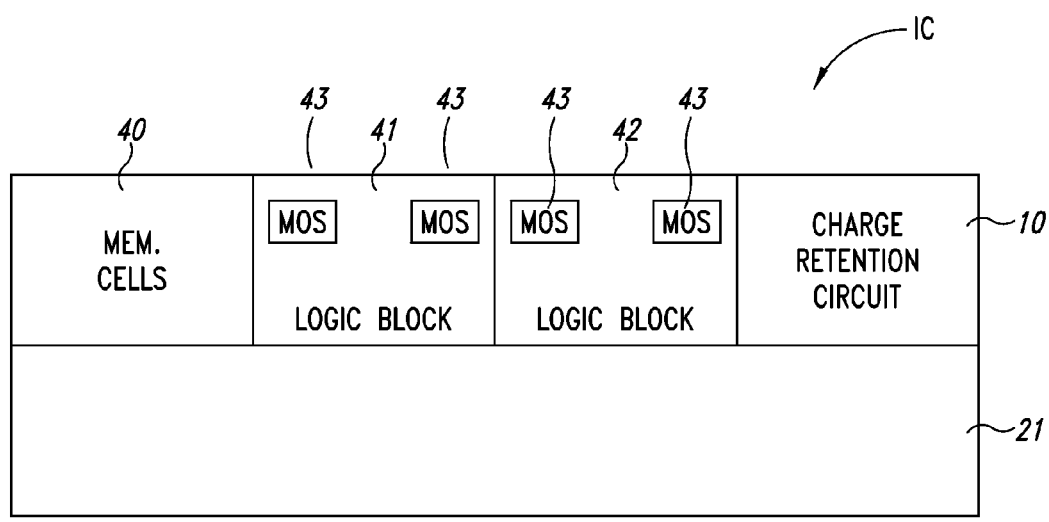
FIG. 6 is a schematic depiction of an integrated circuit chip according to an embodiment of the present application.

Another embodiment shown in FIG. 6 provides an integrated circuit chip IC formed inside and on top of the semiconductor substrate 21, and includes non-volatile memory cells 40, logic blocks 41, 42 including MOS transistors 43, and the electric charge retention circuit 10.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electric charge flow element comprising, on an insulating support, a stack of a first electrode, of a dielectric layer having at least one portion capable of letting charges flow by tunnel effect, and of a second electrode, wherein at least one of the electrodes is made of undoped polysilicon.

2. The element of claim 1, wherein one of the electrodes is made of heavily-doped polysilicon.

3. The element of claim 1, wherein both electrodes are made of undoped polysilicon.

4. The element of claim 1, wherein said dielectric layer comprises an oxide-nitride-oxide stack, said at least one portion being made of silicon oxide.

5. The element of claim 1, having a capacitance between the two electrodes ranging between $1*10^{-15}$ and $10*10^{-15}$ farads.

6. A use of the element of claim 1, for a time measurement.

7. An electric charge retention circuit, comprising:
a capacitive charge storage element; and
a charge flow element electrically coupled to the capacitive charge storage element and including, on an insulating support, a stack of a first electrode, of a dielectric layer having at least one portion capable of letting charges flow by tunnel effect, and of a second electrode, wherein at least one of the electrodes is made of undoped polysilicon.

8. The circuit of claim 7, wherein the capacitive storage element has a capacitance ranging between $10^{-12}$ and $100*10^{-12}$ farads.

9. The circuit of claim 7, further comprising a capacitive initialization element connected to a floating node common to the storage element and to the flow element.

10. The circuit of claim 9, wherein the capacitive initialization element has a capacitance ranging between $10*10^{-15}$ and $100*10^{-15}$ farads.

11. The circuit of claim 7, wherein both electrodes are made of undoped polysilicon.

12. An integrated circuit chip formed inside and on top of a semiconductor substrate, comprising:
non-volatile memory cells,
logic blocks including MOS transistors, and
an electric charge retention circuit including:
a capacitive charge storage element; and
a charge flow element electrically coupled to the capacitive charge storage element and including on an insulating support, a stack of a first electrode, of a dielectric layer having at least one portion capable of letting charges flow by tunnel effect, and of a second electrode, wherein at least one of the electrodes is made of undoped polysilicon.

13. The integrated circuit chip of claim 12, wherein the capacitive storage element has a capacitance ranging between $10^{-12}$ and $100*10^{-12}$ farads.

14. The integrated circuit chip of claim 12, wherein the electric charge retention circuit includes a capacitive initialization element connected to a floating node common to the storage element and to the flow element.

15. The integrated circuit chip of claim 12, wherein both electrodes are made of undoped polysilicon.

* * * * *